US006724662B2

United States Patent
Manea

(10) Patent No.: US 6,724,662 B2
(45) Date of Patent: Apr. 20, 2004

(54) METHOD OF RECOVERING OVERERASED BITS IN A MEMORY DEVICE

(75) Inventor: Danut I. Manea, Cupertino, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/235,265

(22) Filed: Sep. 4, 2002

(65) Prior Publication Data

US 2004/0052143 A1 Mar. 18, 2004

(51) Int. Cl.[7] ............................................. G11C 16/04
(52) U.S. Cl. ........................ 365/185.3; 365/185.29; 365/185.22; 365/218; 365/185.19; 365/189.07; 365/185.2
(58) Field of Search ...................... 365/185.3, 185.29, 365/185.22, 218, 185.18, 185.19, 189.07, 185.2

(56) References Cited

U.S. PATENT DOCUMENTS

| 5,043,940 A | 8/1991 | Harari | 365/168 |
|---|---|---|---|
| 5,268,870 A | 12/1993 | Harari | 365/218 |
| 5,272,669 A | 12/1993 | Samachisa et al. | 365/185 |
| 5,293,560 A | 3/1994 | Harari | 365/185 |
| 5,434,825 A | 7/1995 | Harari | 365/185 |
| 5,742,541 A | * 4/1998 | Tanigami et al. | 365/185.3 |
| 5,901,090 A | * 5/1999 | Haddad et al. | 365/185.29 |
| 6,011,721 A | * 1/2000 | Sunkavalli | 365/185.22 |
| 6,097,637 A | 8/2000 | Bauer et al. | 365/185.24 |
| 6,205,059 B1 | * 3/2001 | Gutala et al. | 365/185.33 |
| 6,275,415 B1 | 8/2001 | Haddad et al. | 365/185.11 |
| 6,317,363 B1 | 11/2001 | Guterman et al. | 365/185.23 |
| 6,327,183 B1 | 12/2001 | Pawletko et al. | 365/185.18 |
| 6,327,189 B2 | 12/2001 | Banks | 365/189.01 |

* cited by examiner

Primary Examiner—Michael S. Lebentritt
Assistant Examiner—Nam Nguyen
(74) Attorney, Agent, or Firm—Thomas Schneck

(57) ABSTRACT

A method of recovering overerased bits in a memory cell. In the method, a pair of reference currents are internally generated to define a current window corresponding to the erased state of the memory cell. The first reference current defines the highest current of the current window and the second reference current defines the lowest current of the current window. Then, it is determined which of the memory cells in a memory array are in an overerased state by having an amount of charge on its floating gate that corresponds to a conduction current during a read operation that is greater than the first reference current. Then, the overerased cells are programmed until the cells are in the erased state.

15 Claims, 9 Drawing Sheets

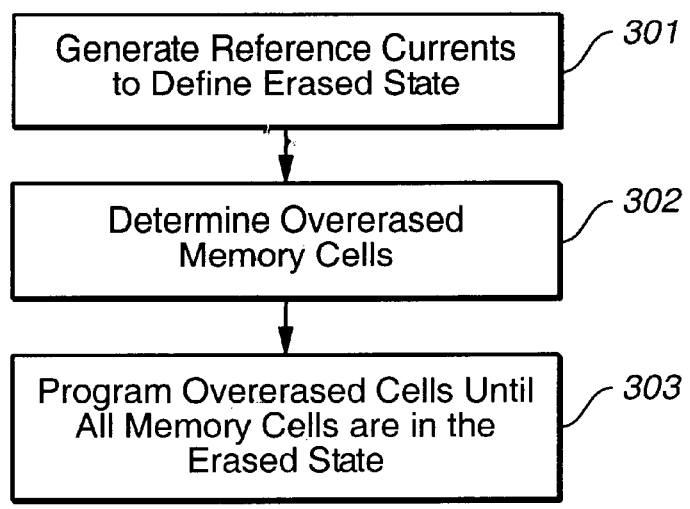
FIG._1
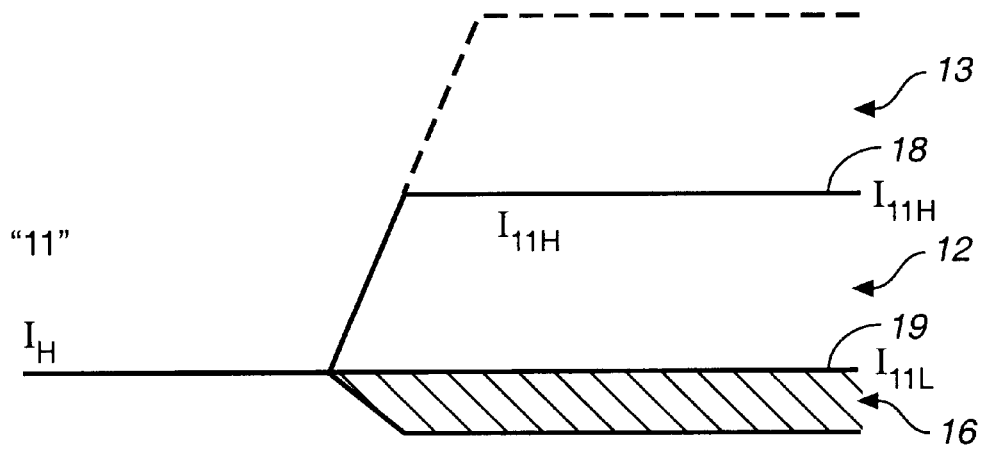
FIG._3

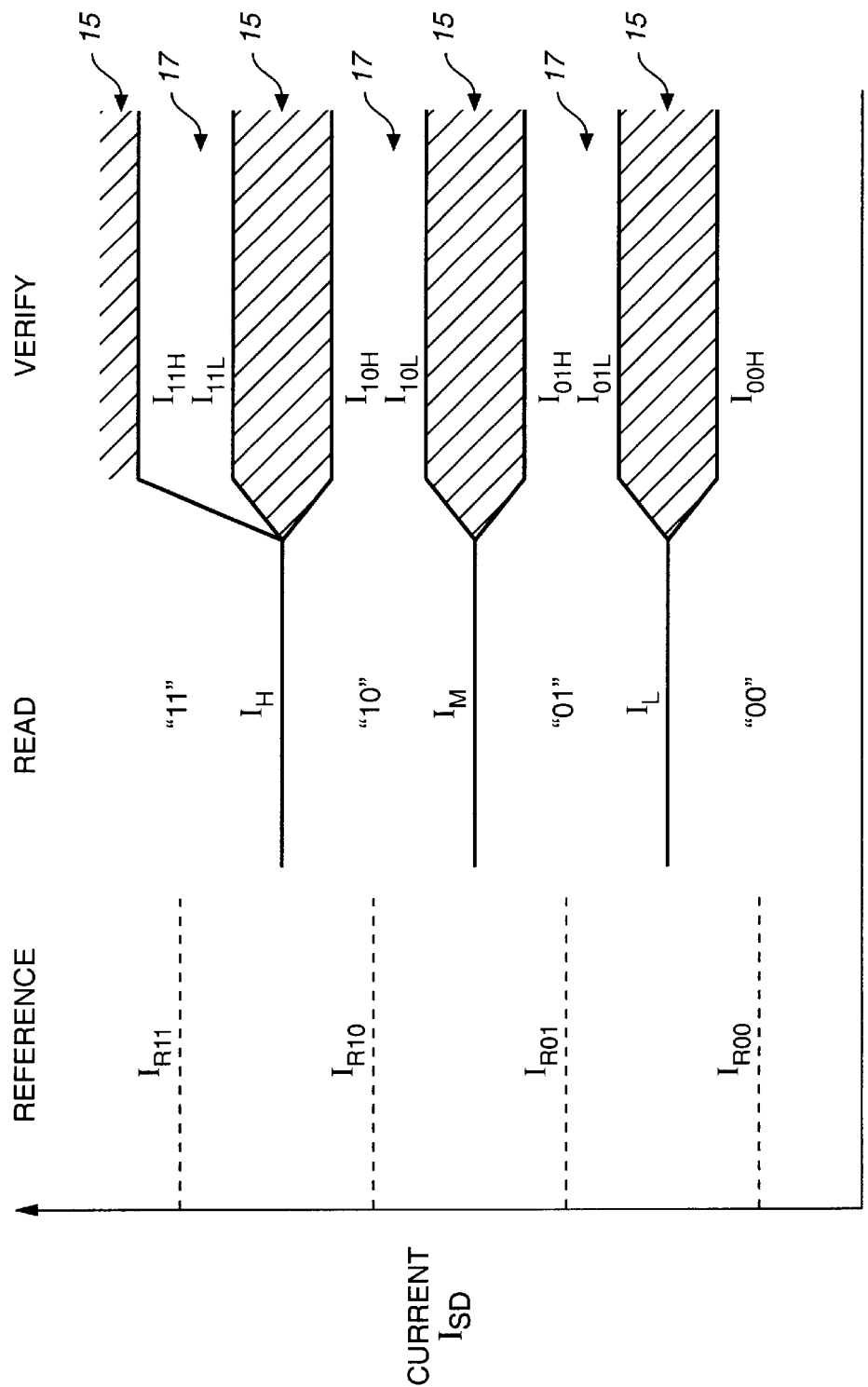
FIG._2

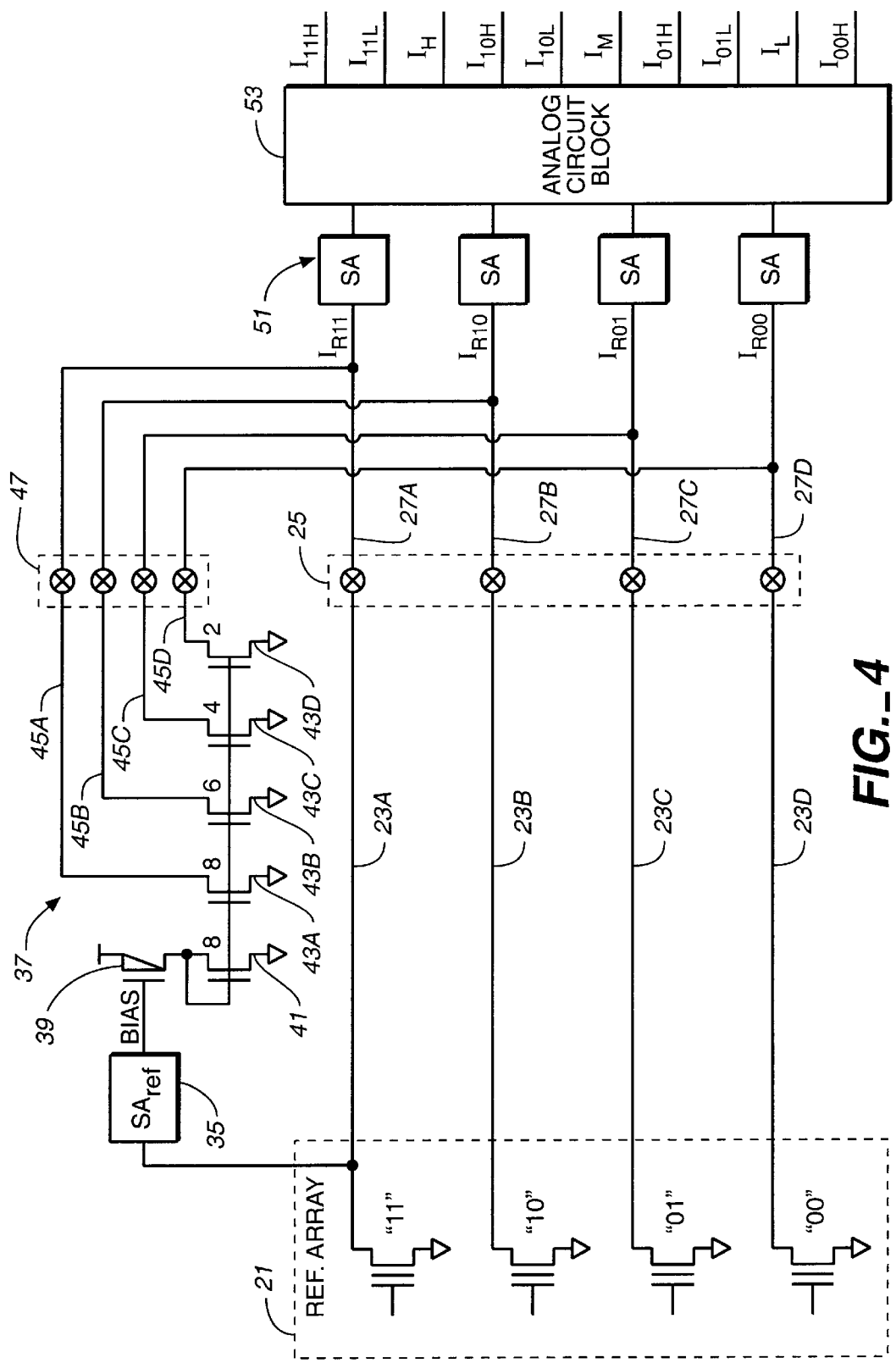
FIG._4

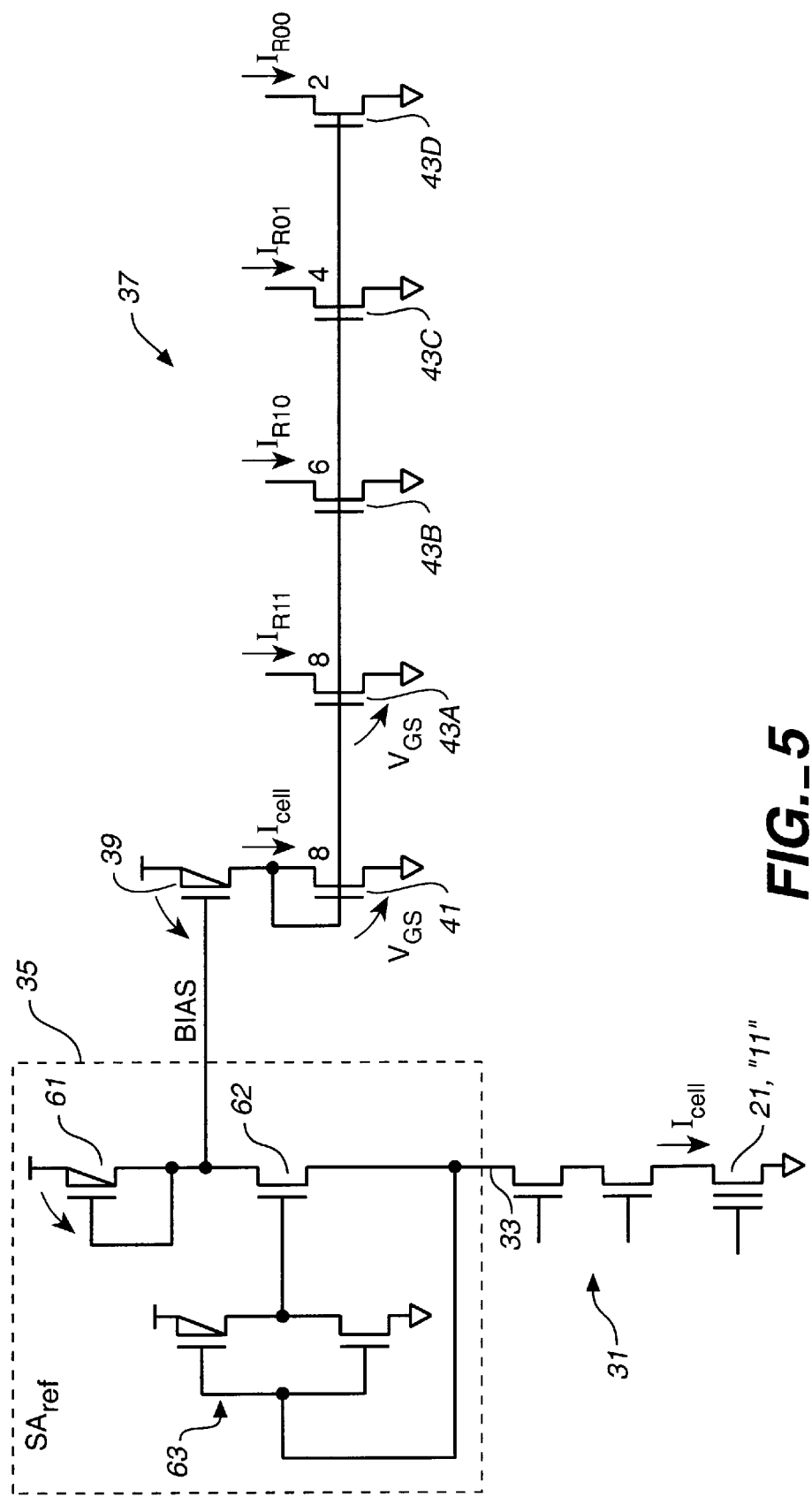
FIG._5

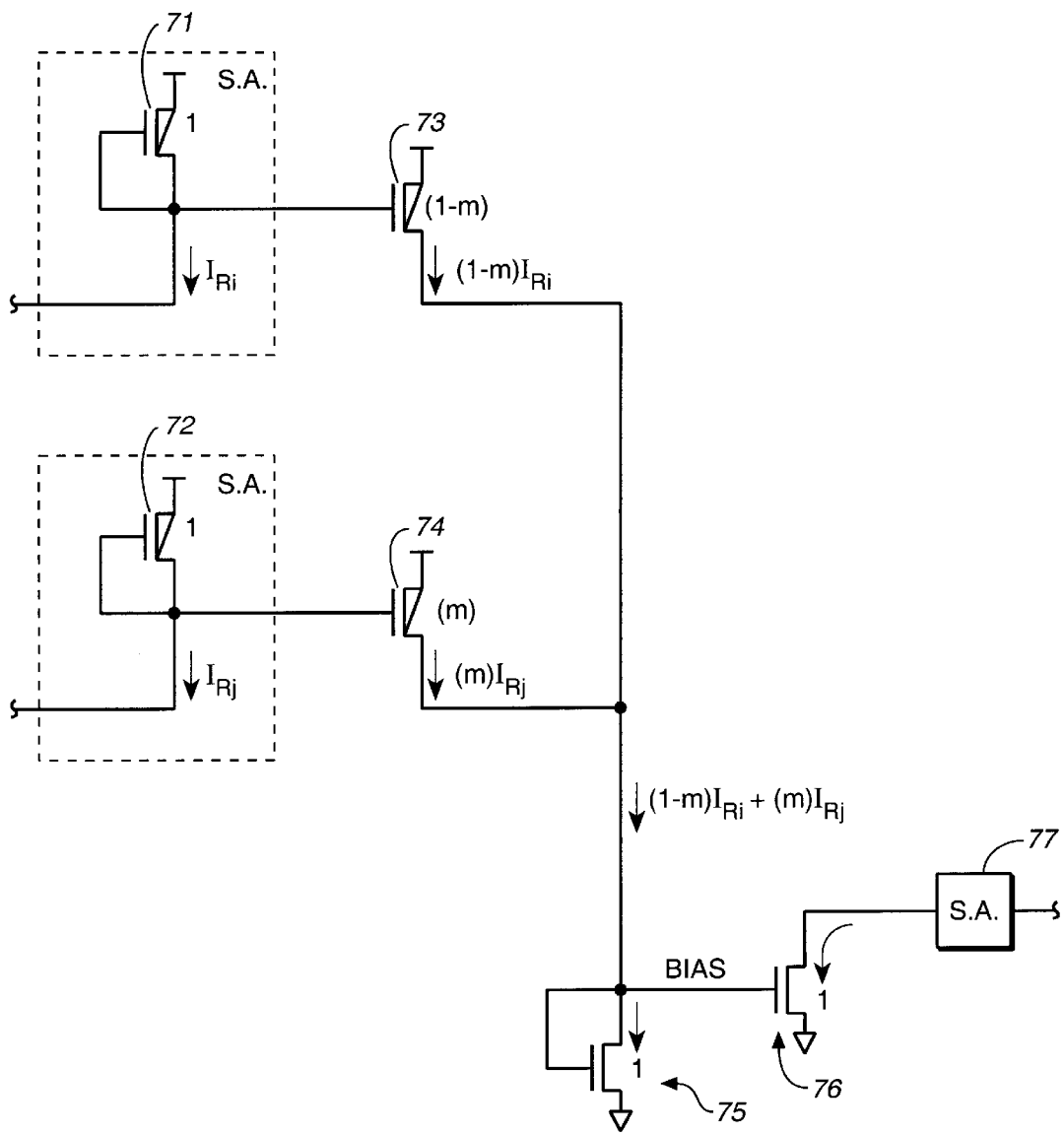
FIG._6

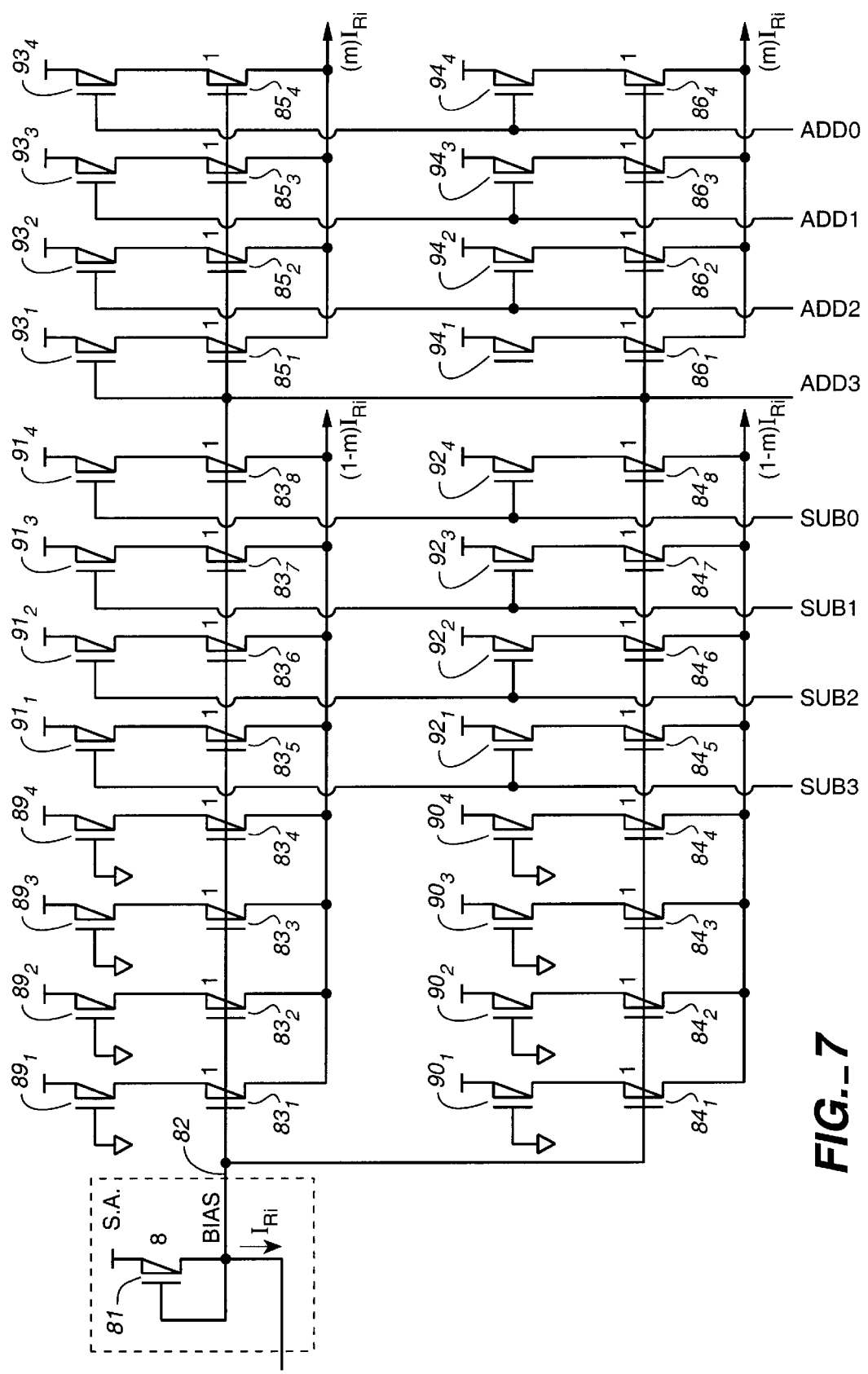
FIG._7

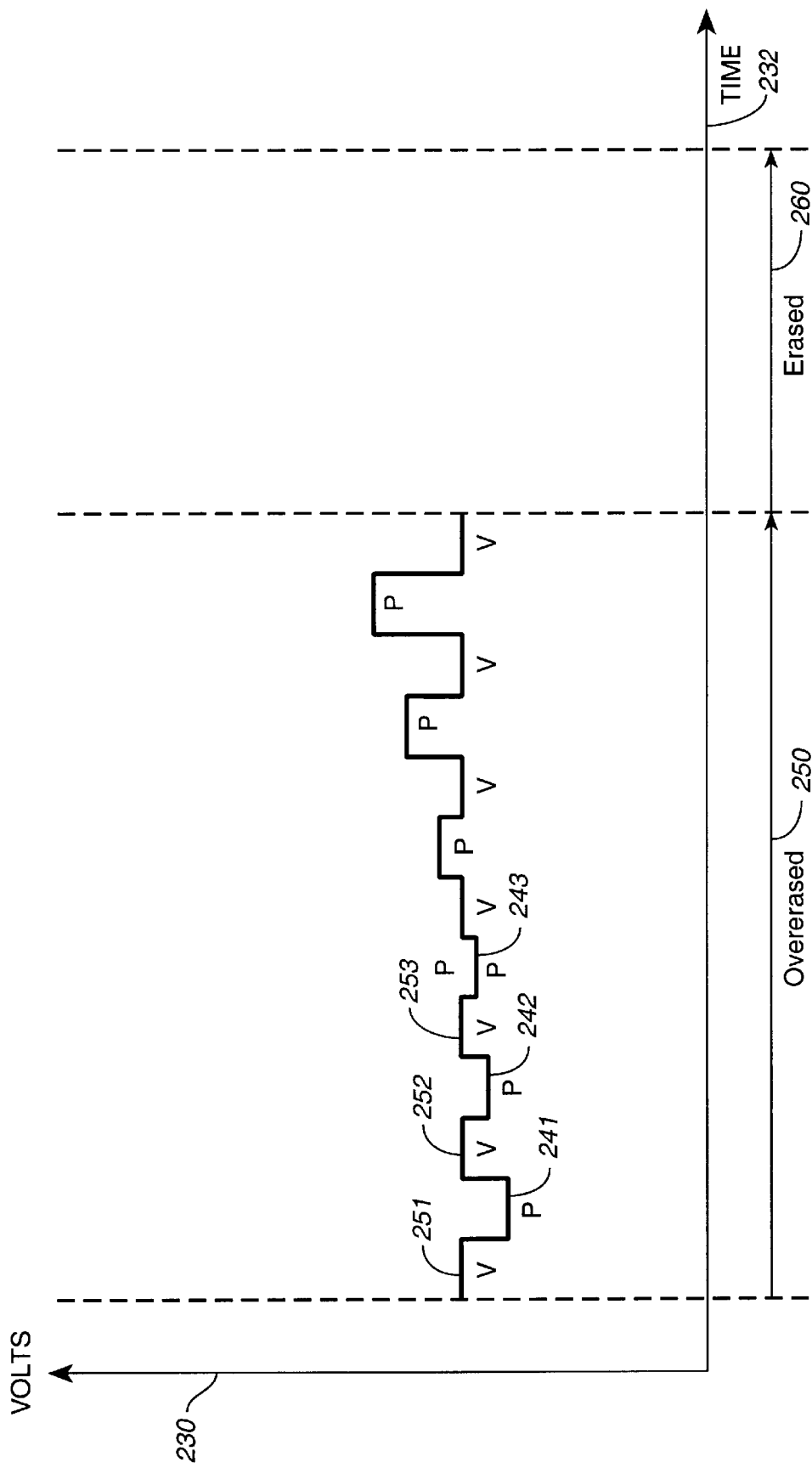
FIG._8

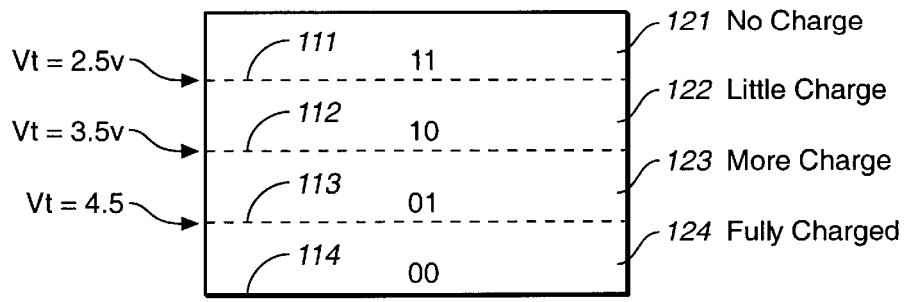
FIG._9
*(PRIOR ART)*
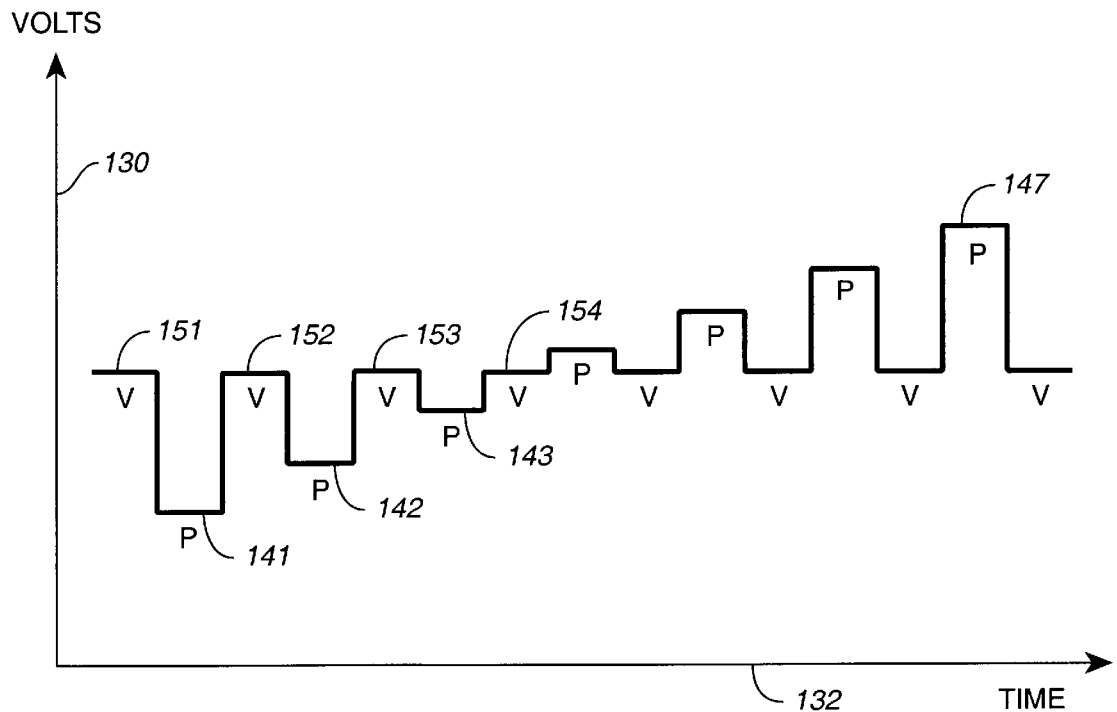
FIG._10
*(PRIOR ART)*

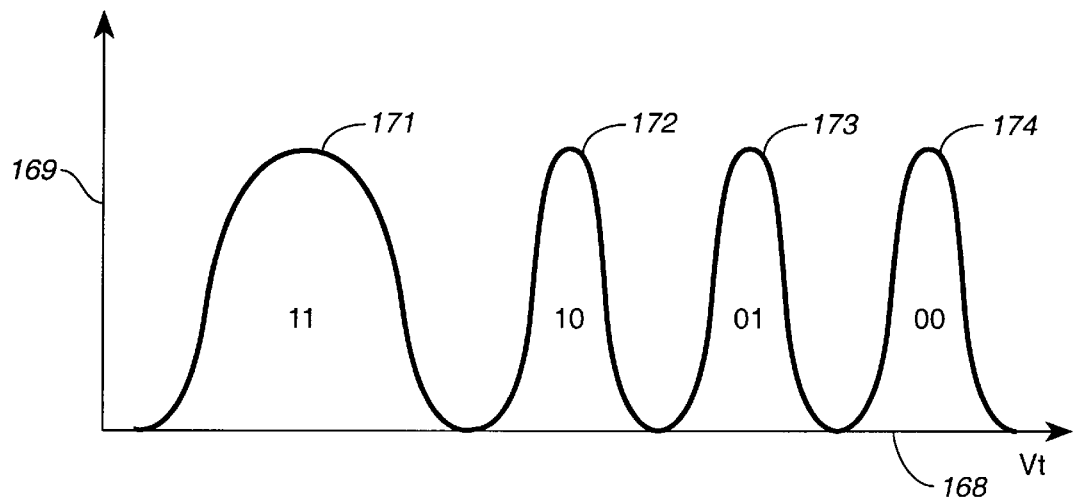
FIG._11
(PRIOR ART)
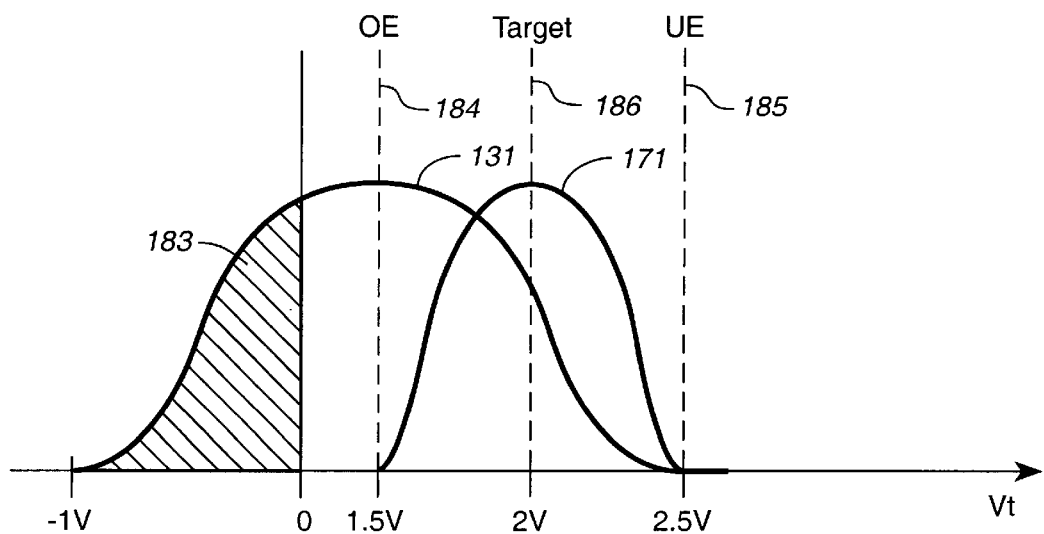
FIG._12
(PRIOR ART)

METHOD OF RECOVERING OVERERASED BITS IN A MEMORY DEVICE

TECHNICAL FIELD

This invention relates to semiconductor memory devices, and more particularly to a method of recovering overerased bits in memory devices.

BACKGROUND ART

In conventional single bit per cell memory devices, the memory cell assumes one of two information storage states, either an on-state or an off-state. This combination of either on or off defines one bit of information. In bi-level memories, since the cells can only have two different values of threshold voltage, Vt, during the reading operation, it is only necessary to sense whether or not the addressed transistor is conductive. This is generally done by comparing the current flowing through the memory transistor biased with predetermined drain-to-source and gate-to-source voltages with that of a reference transistor under the same bias conditions, either directly through current-mode sensing or after a current-to-voltage conversion through voltage-mode sensing.

In programming a typical single-bit-per-cell flash memory cell, a high potential (such as, for example, approximately 9–12 volts) is applied to the control gate of the cell, the source terminal is grounded, and the drain terminal is connected to a voltage of about 5 volts. This operation can be performed in an array by selectively applying the pulse to the word line which connects the control gates, and biasing the bit line which connects the drains. This is commonly known in the art as the hot electron injection method of programming flash memory cells. Hot electron injection is used to move charge in the floating gate, thus changing the threshold voltage of the floating gate transistor. By placing the high voltage on the control gate, this generates electrons to flow in the channel and some hot electrons are injected on to the floating gate and change the potential of the floating gate to be more negative. Therefore, injection tends to saturate and the threshold voltage of a floating gate transistor follows the same trend. The state of the memory cell transistor is read or sensed by placing an operating voltage (for example, approximately 4–6 volts) on its control gate and 0.5–1 volts on the drain, and then detecting the level of current flowing between the source and drain to determine which memory state the cell is in.

Programming and sensing schemes for multi-level memory devices are more complex, typically requiring $2^n-1$ voltage references, where n is the number of bits stored in the cell. With reference to FIG. 9, an example of a prior art multi-level memory device is shown having two bits per cell which corresponds to four memory levels having three voltage references. A first memory level 121, represented by the binary number 11, is the state in which the memory cell has no charge. The memory level 124 in which the memory cell is fully charged is represented by the binary number 00. (The terms "no charge" and "fully charged" are used herein, and throughout this discussion, for the purposes of explanation and are not intended to be limiting. For example, the (11) state could have a slight amount of charge and the (00) state could have an amount of charge less than the absolute maximum amount of charge.) In between the uncharged state (11) 121 and the fully charged state (00) 124 are a first intermediate level 122, represented by the binary number 10, in which the memory cell has a small amount of charge, and a second intermediate level 123, represented by the binary number 01, in which the memory cell has more charge than the 10 state but is not fully charged. The threshold voltages (Vt) shown in between each of the memory states of the memory cell represent the threshold voltages needed to transition between memory cell states. As discussed, for a two-bit cell having four memory levels, there are three voltage references 111, 112, 113. For example, at the threshold voltage of 2.5 volts, the memory state is at the reference level 111 where the state of the cell will transition from the 11 state to the 10 state. At a voltage threshold Vt=3.5 volts, the memory cell is at the reference level 112 where the state of the cell will transition from the 10 state to the 01 state. And at the voltage threshold of Vt=4.5 volts, the memory cell is at the reference level 113 where the state of the cell will transition from the 01 state to the 00 state. The threshold voltage values shown in FIG. 9 are merely illustrative and the actual values of Vt will depend on the construction of the memory cell.

One of the main difficulties in implementing multi-level nonvolatile memory cells is being able to accurately program the cell, i.e. to place just the amount of charge on the floating gate of the cell transistor that is required to obtain the target value of the threshold voltage. The usual manner that is used in the prior art to deal with the problem of accurate charge placement is by using a cell-by-cell program and verify approach. In the program and verify approach, the programming operation is divided into a number of partial steps and the cell is sensed after every step to determine whether or not the target threshold voltage is achieved, so as to continue the programming if this is not the case. As each cell is independently controlled during programming, this technique allows simultaneous programming of a whole byte or even a number of bytes. This procedure ensures that the target Vt is reached, with the accuracy allowed by the quantization inherent in the use of finite programming steps. However, this process can be very long and must be controlled by on-chip logic circuitry.

A typical program and verify technique is illustrated in FIG. 10. As shown in FIG. 10, the programming of the memory cell is implemented by an alternating sequence of programming and verifying voltage pulses. The voltage 130 of each programming pulse incrementally increases with respect to time 132 until the desired target voltage is reached. The voltage level of the verify pulse remains constant throughout the programming process. For example as shown, after a first verify pulse 151, a first programming pulse 141 is implemented, and then a verify pulse 152 follows. A next programming pulse 142 of an incrementally increased potential is applied, followed by a verify pulse 153, followed by a third programming pulse 143 which is increased in voltage from the previous programming step, followed by a next verify pulse 154 and so on, until the final programming pulse 147 is applied to allow the cell to reach the threshold voltage of the desired memory state. As can be seen in FIG. 10, the shape of the graph resembles a staircase, and this programming method is generally known in the art as staircase gate voltage ramp programming. This staircase method is described in numerous patents, including, for example, U.S. Pat. Nos. 5,043,940; 5,268,870; 5,293,560; and 5,434,825.

The electrical erase of a flash memory cell is usually a global operation that is applied to entire sections of a memory array. Each sector has its own internal source line and its own circuitry used to switch this line. To perform the erase, a high electric field is provided between the source and the floating gate of the cell, causing the extraction of negative charge from the floating gate by means of Fowler-Nordheim tunneling. Typically, the erase operation is accomplished by placing a large negative voltage, such as −10V, on the floating gate and a positive voltage, such as 6V on the source.

FIG. 11 illustrates the ideal threshold voltage distribution for a multi-level memory device. The Vt distribution for each memory level is in the typical bell-shaped curve, with greatest number of cells at the target Vt at the center of the cell distribution curve and the number of cells decreasing as the voltage moves away, on both sides, from the target Vt. The cell distribution curves 172, 173, 174 for the states 10, 01 and 00 are similar to each other and are much tighter than the curve 171 for the 11 state. This is because the curve 171 for the 11 state is created by the erase mechanism, since the 11 state is the erased state, while the other states 10, 01 00 are created by the programming algorithm. This Vt distribution is similar for single-bit memory devices, except that there is one erased state and only one programming state.

One of the problems in erasing flash memory cells is the fact that the cell current distribution is not consistent. Not every memory cell erases at the same threshold voltage due to variations in oxide thicknesses, the location of the die in relation to the center of the wafer, and other such factors. Therefore, because some memory cells are erased faster than others, the memory cells that become erased more quickly can become overerased. This is because the erase mechanism in flash memories does not stop by itself; as long as the erasing voltage is applied to the memory cell, electrons are continuously removed from the floating gate and the erasing pulse is not stopped at the right time. Since the erase operation continues until all of the memory cells in the sector being erased have been erased, some of the memory cells will be overerased.

FIG. 12 illustrates this concept of overerased bits. Cell distribution curve 171 represents an ideal curve in which the target threshold voltage 186 (or the threshold voltage at which most of the cells end up following the erase operation) is 2V. The undererase threshold voltage 185, or the maximum threshold voltage at which a cell is considered to be erased, is shown to be 2.5 volts. The overerase threshold voltage 184 is shown to be 1.5 volts. As explained above, it is difficult to control the cell distribution when erasing a large array of memory cells. Often times, the distribution curve would be more like curve 181. In this case, a number of memory cells 183 have been overerased due to the cells having been erased faster than other memory cells in the array. Because the erase mechanism operates until the last memory cell in the array is erased to beyond the undererase threshold 185, the faster cells 183 become overerased.

Overerasing of the memory cells is not desirable and can be a potential cause of failure because the memory array cannot be read correctly if it contains depleted cells, as all of the cells connected to the same bitline of a depleted cell would be read as a "1", regardless of the actual content of the cell.

In the prior art, different soft-programming techniques have been developed to solve the problem by recovering overerased bits. For example, a small constant voltage can be applied on the wordline, such as for example 1.5V, and then a soft-programming operation can be done to program cells below 1.5V back up to the overerase threshold. However, all of the proposed soft-programming recovery techniques are time and power consuming, which is undesirable. Other techniques for recovering overerased bits involve generating a separate reference current. This is also not desirable because it does not use the existing reference cell and thus adds more complexity and power consumption.

It is the object of the present invention to provide a method of recovering the overerased bits in a memory cell which does not require soft-programming techniques and does not require the generation of a separate reference current.

It is a further object of the invention to provide a method of recovering the overerased bits in a memory cell which is faster and consumes less power.

SUMMARY OF THE INVENTION

The above objects have been achieved by a method of recovering overerased bits in a memory device, in particular a multi-level memory device, in which a pair of reference currents are generated internally to define a current window corresponding to the erased or "11" state. The first reference current defines the highest current of the current window and the second reference current defines the lowest current of the current window. Then, it is determined which of the memory cells in the memory array have an amount of charge on its floating gate that corresponds to a conduction current that is greater than the first reference current. This group of memory cells is in an overerased state. Then, a plurality of alternating programming and verifying pulses are applied to each of the group of overerased memory cells in order to program the overerased cells to the erased state. The programming pulses are at the same voltage levels as is used to program the memory cells to the other memory states (such as "10", "01", "00"). Therefore, the method uses the existing programming approach and programs the "11" state in the same manner as the other memory states. This results in a fast and more precise recovery of overerased bits. The method also does not require soft-programming or the generation of separate reference currents, which helps to conserve power and to simplify the process.

BRIEF DESCRIPTION OF THE DRAWINGS

FIG. 1 is a flow chart of the method of the present invention.

FIG. 2 is a graph of memory cell conduction current levels $I_{SD}$ for respective reference, read and verify, with the read and verify current levels being generated in the present invention from the reference current levels.

FIG. 3 is a graph of memory cell conduction current levels for the overerased and erased memory levels.

FIG. 4 is a schematic circuit diagram of a circuit generating the reference current levels used in the method of the present invention.

FIG. 5 is a schematic circuit diagram of a detailed circuit portion of FIG. 4 for optionally generating the reference current levels from a single reference memory cell.

FIG. 6 is schematic circuit diagram illustrating a portion of the analog circuit block in FIG. 4 for generating the read and verify current levels from the supplied reference currents.

FIG. 7 is a schematic circuit diagram showing in further detail one element of the analog circuit block generating fractional currents of a supplied reference current with a selected margin value m for subsequent use according to the scheme of FIG. 5 in generating read and verify current levels.

FIG. 8 is a graph showing the voltage to time relationship for the program and verify pulse steps used in the present invention.

FIG. 9 is a representation of a two-bit memory cell having four memory states as is known in the prior art.

FIG. 10 is a graph showing the voltage to time relationship for the program and verify pulse steps of the staircase programming method, as is known in the prior art.

FIG. 11 is a graph of the threshold voltage distribution for a four state memory cell as is known in the prior art.

FIG. 12 is a graph of the threshold voltage distribution curve for the erased state "11", in which some cells are overerased, as is known in the prior art.

BEST MODE OF CARRYING OUT THE INVENTION

With reference to FIG. 1, the first step 301 in the method of the present invention is to generate a pair of reference currents to define a current window corresponding to the state in which the memory cell is fully erased. FIG. 2 shows the reference, read and verify current levels for a four level memory cell array. The present invention is not limited to four level memory cell arrays, and can also be used in single-bit memory cells, as well as in other types of memory cell arrays, such as memory cell arrays with 8, 16 or other numbers of memory cell states. Four reference current levels $I_R$ are provided, one for each memory state. These are designated $I_{R00}$, $I_{R01}$, $I_{R10}$ and $I_{R11}$ for the four memory states "00", "01", "10" and "11". State "11" typically corresponds to the fully erased state, state "00" to the fully programmed state, and "01" and "10" to intermediate states.

The fully erased state has the least charge (substantially zero) stored on the floating gate of the nonvolatile memory cell transistor structure, and has the lowest threshold voltage and largest conduction current of the four memory states. The fully programmed state has the most charge stored on the floating gate, and has the highest threshold voltage (often larger than the applied gate voltage during a read operation) and lowest conduction current (possibly zero) of the four states. The intermediate states have stored charge amounts that are between that of the fully erased and fully programmed states, and thus have intermediate threshold voltage and conduction current levels.

The reference current levels $I_{R00}$, $I_{R01}$, $R_{10}$ and $I_{R11}$ are set by programmed reference memory cells at the center of the respective states, furthest from the read boundaries with adjacent states.

For a four state memory cell, three read boundaries exist between adjacent states. These are read current levels $I_L$, $I_M$ and $I_H$ (low, medium and high). $I_L$ is the boundary between adjacent memory states "00" and "01", $I_M$ is the boundary between adjacent memory states "01" and "10", and $I_H$ is the boundary between adjacent memory states "10" and "11". These boundary levels are preferably defined in the present invention as the arithmetic average between the corresponding adjacent states.

$I_L=(0.50)I_{R00}+(0.50)I_{R01};$ $I_M=(0.50)I_{R01}+(0.50)I_{R10};$ and $I_H=(0.50)I_{R10}+(0.50)I_{R10}.$ Read current levels somewhat above or below those preferred values may be used, as the margin need not be exactly 0.50. However, a margin of substantially 50%, i.e. between about 40% and 60%, is generally desired. For example, if a margin of 45% is used, $I_L=(0.55) I_{R00}+(0.45) I_{R01}$, etc. and the read currents will be slightly lower than it would be with an exactly 50% margin. (Also, the margins need not be exactly the same for all three state boundaries $I_L$, $I_M$, $I_H$.) During a typical memory cell read operation, sense amplifiers and a comparison circuit compare the conduction current of a selected memory cell with the respective read boundary current levels to establish which of the four states that memory cell is in. This read operation is not part of the present invention and can be done by any known method using the (n−1) boundary current levels supplied by the present invention to determine one of the n memory states for a selected multilevel memory cell.

A typical program operation consists of a sequence of short program and verify steps until a selected memory cell arrives at the desired programmed state. For programming, a margin value m is used to create windows 17 of allowable current values for each state. Regions 15 between the windows 17 are current levels that are forbidden as final program states. The forbidden zones 15 include the read boundary levels and a suitable margin to account for operational variations in memory cell conditions, such as temperature. Thus, in the present invention, upper and lower window levels are established for most memory states for the program verify operation. For the fully erased state "11", the upper and lower window levels are only used to verify overerase recovery. For the fully programmed state "00", a lower window level is not needed, as there is no overprogrammed condition. Thus, a total of seven verify current levels $I_{11H}$, $I_{11L}$, $I_{10H}$, $I_{10L}$, $I_{01H}$, $I_{01L}$, and $I_{00H}$ are defined for the four memory states.

$I_{11H}=(1+m)I_{R11};$ $I_{11L}=(1-m)I_{R11}+(m)I_{R10};$ $I_{10H}=(1-m)I_{R10}+(m)I_{R11};$ $I_{10L}=(1-m)I_{R10}+(m)I_{R01};$ $I_{01H}=(1-m)I_{R01}+(m)I_{R10};$ $I_{01L}=(1-m)I_{R01}+(m)I_{R00};$ and $I_{00H}=(1-m)I_{R00}+(m)I_{R01}.$ The margin value(s) m is less than the margin used to define the read boundaries (less than 50%, i.e. less than 0.5 if the preferred read margin of 50% is sued for $I_L$, $I_M$ and $I_H$), and is typically between 0.05 and 0.375. Values between 0.10 and 0.25 are preferred. Smaller margin values m (with smaller allowed program windows 17 and larger forbidden zones 15) are preferred when large operational variations are expected, whereas most often a value of about 0.25 will be adequate. A preferred embodiment of the analog circuit block used in the present invention for establishing the verify levels allows any of the values 0.125, 0.25, or 0.375 to be selected for the margin m. The margin value can differ for the different states.

There are many possible ways to generate the reference currents used in the present invention. In one embodiment of the invention, the step of generating the reference currents focuses on defining the upper and lower current window levels for the fully erased state "11". However, the circuits for generating the reference currents are used to define all of the states of the memory cells and are described in detail below with reference to FIGS. 4–7. With reference to FIG. 3, a first reference current $I_{11H}$ 18 is generated to define the highest current of a current window 12, and a second reference current $I_{11L}$ 19 is generated to define the lowest current of a current window 12. Current window 12 defines a first reference level corresponding to the fully erased state "11". Any memory cell having an amount of charge on its floating gate that corresponds to a conduction current during a read operation that is greater than the first reference current is in the overerased state 13. Any memory cell having an amount of charge on its floating gate corresponding to a conduction current that is between the first reference current and the second reference current is in the erased state 12. Zone 16 is a forbidden zone between the erased state and the first programmed state, as discussed above. By defining the reference voltage $I_{11H}$ 18 and $I_{11L}$ 19, this provides a target window for determining which memory cells are overerased. The techniques for generating the reference currents 18, 19 are described below with respect to generating reference currents for the entire memory device.

With reference to FIG. 4, the reference currents $I_{R00}$, $I_{R01}$, $I_{R10}$ and $I_{R11}$ are generated using reference memory cells in a reference array 21. There are different options, including using a single reference cell to generate all reference currents and using a separate reference cell to generate each of the reference currents. (An intermediate option where two or more cells generate multiple reference currents is also possible, especially where there are 8 or more states.) Where separate cells generate the several reference currents, these currents are supplied by the reference memory cells along lines 23A–23D through switches 25 to the reference current output lines 27A–27D and then to sense amplifiers 51 associated with an analog circuit block 53. The reference memory cells are pre-programmed by the manufacturer to the respective states "11", "10", "01" and "00". These define the center of each state's read and program window.

When a reference memory cell is used to generate multiple reference currents, including the case where a single reference memory cell generates all of the reference currents for all of the states to be defined, the current conducted by that reference memory cell is supplied over an alternative line 33 to a reference sense amplifier 35 to produce a BIAS voltage for a current mirror circuit 37. For a four state per cell memory, the single reference memory cell corresponds to the fully erased "11" state (minimum floating gate charge, minimum threshold voltage, maximum conduction current). The various reference currents produced by the current mirror circuit 37 are supplied on lines 45A–45D through a set of switches 47 to the reference current output lines 27A–27D and then to the sense amplifiers 51 associated with the aforementioned analog circuit block 53. Only one set of switches 25 and 47 are set to pass current to the sense amplifiers 51, as determined by whether one or all reference memory cells are used to generate the reference currents.

With reference to both FIGS. 4 and 5, the reference sense amplifier 35 and current mirror circuit 37 generate reference currents for multiple memory states from a single reference memory cell of state "11" in the reference array 21. The cell conduction current $I_{cell}$ flows, through y-select pass transistors 31, along line 33 from the sense amplifier 35 to that reference memory cell. A typical sense amplifier can include a diode-connected p-channel transistor 61, an n-channel transistor, and an inverter 63, connected to the reference memory cell 21 ("11"), so that the current $I_{cell}$ produces a BIAS voltage at the node between the p-channel and n-channel transistors 61 and 62, with the BIAS voltage creating a mirror current $I_{cell}$ through p-channel pull-up transistor 39 (because both transistors 61 and 39 have the same drain-to-gate voltage drop). A diode-connected n-channel transistor 41 connected between the transistor 39 and ground has a gate-to-source voltage drop $V_{GS}$ determined by the mirror current $I_{cell}$ conducted through transistor 41. This voltage drop $V_{GS}$ is applied to the gates of four other n-channel transistors 43A–43D. The transistor 41 has a specific channel size (for convenience represented by the numeral 8). Transistors 43A–43D have different channel sizes, at most one (but not necessarily any) of which may be the same size as transistor 41 (here represented by numerals 8, 6, 4 and 2). The same applied voltage drop $V_{GS}$ generates different currents proportional to their channel sizes. In the example used here, conduction current $I_{R11}$ through transistor 43A of size 8 (equal in this example to the channel size of transistor 41) is equal to $I_{cell}$. Conduction current $I_{R10}$ through transistor 43B of channel size 6 is ¾ $I_{cell}$. Conduction current $I_{R01}$ through transistor 43C of channel size 4 is ½ $I_{cell}$. Finally, conduction current $I_{R00}$ through transistor 43D of size 2 is ¼ $I_{cell}$. The resulting conduction currents $I_{R11}$, $I_{R10}$, $I_{R01}$ and $I_{R00}$ are placed on lines 45A–45D as previously mentioned. These sizes and current values are representative, and can be selected by manufacturing transistors 43A–43D of any desired set of sizes. The reference currents need not have a linear relationship. Indeed, it might be desired to have the separation between $I_{R11}$ and $I_{R11}$ greater than the separation between other reference currents due to the rapidity at which charge is initially injected into fully erased memory floating gates compared to the slower injection of partially charged floating gates. In that case the relative sizes of transistors 43A–43D might be approximately 8, 5, 3 and 1.

With reference to FIG. 6, for any given reference current $I_{Ri}$, a fractional current $(1-m)I_{Ri}$ for some margin value m can be produced using a current mirror technique like that used to generate multiple reference currents from a single current in FIGS. 4 and 5 above. Likewise, for any given reference current $I_{Rj}$, a fractional current $(m)I_{Rj}$ can also be produced. In this technique the diode-connected p-channel transistors 71 and 72 of a first channel size (designated by numeral 1) produce a voltage drop dependent upon the input reference current $I_{Ri}$ or $I_{Rj}$. P-channel transistors 73 and 74 have their gates connected to the gate-source of respective transistors 71 and 72. Transistors 73 and 74 have respective channel sizes of $(1-m)$ and $(m)$ relative to that of transistors 71 and 72. With the same drain-gate voltage drop across transistors 73 and 74 as across corresponding transistors 71 and 72, the transistors 73 and 74 conduct respective $(1-m)I_{Ri}$ and $(m)I_{Rj}$ currents. These currents can be combined with a simple connection to generate a current $(1-m)I_{Ri}+(m)I_{Rj}$. This combined current can likewise be sensed using a current mirror and sense amplifier elements 75–77 whose operation is like that described above for elements 35 and 39 in FIG. 5. The resulting current output may be compared during a read or verify step with a current from an addressed memory cell. For reads, m=0.5, while for program verify operations m<0.5. (FIG. 7 shows a preferred embodiment that allows a user to select m from any of 0.125, 0.25, 0.375 or 0.5, with the latter used only during read operations.) Also for verify, the lower bound of the allowed current of a state uses j=i−1. As previously discussed, there is no lower current boundary for the fully programmed "00" state. The upper bound of the allowed current of a state during a program verify operation uses j=i+1, except for the fully erased state "11". For the fully erased state "11", $I_{11H}=(1+m)I_{R11}$ is generated by summing three currents, $(1-m)I_{R11}$, $(m)I_{R11}$ and again $(m)I_{R11}$.

With reference to FIG. 7, one element of the analog circuit block 53 of FIG. 4 receives a reference current $I_{Ri}$ for a state i and generates fractional currents $(1-m)I_{Ri}$ and $(m)I_{Ri}$ for a selected margin value m for use as in FIG. 6 to generate the read and verify currents set forth in FIG. 2 as defined above. The element shown in FIG. 7 is repeated so that each of the reference currents $I_{R11}$, $I_{R10}$, $I_{R01}$ and $I_{00}$ has its own fractional current generating element. A single set of fractional currents $(1-m)I_{R00}$ and $(m)I_{R00}$ is needed from reference current $I_{R00}$. Two of each of the fractional currents $(1-m)I_{R01}$, $(m)I_{R01}$, $(1-m)I_{R10}$, $(m)I_{R10}$, and $(1-m)I_{R11}$ are needed to be generated from the reference currents $I_{R01}$, $I_{R10}$ and $I_{R11}$. Three sets of the fractional current $(m)I_{R11}$ are needed, one for use in the verify current $I_{11L}$ and two for use in the verify current $I_{11H}$ in order to get $(1+m)I_{R11}$. Since read and verify current levels are never needed at the same time, the read current levels $I_H$, $I_M$ and $I_L$ can share the same circuit elements as that used to generate the verify levels without additional overhead. The margin value m is merely switched to 0.50 when a read operation is indicated.

In FIG. 7, a sense amplifier including a diode-connected p-channel transistor 81 conducts the supplied reference current $I_{Ri}$ and generates a drain-gate voltage drop and a corresponding BIAS voltage on line 82 that drives the gates of transistors $83_1$–$83_8$, $84_1$–$84_8$, $85_1$–$85_4$ and $86_1$–$86_4$. The transistor 81 has a channel size, represented here by the numeral 8, that corresponds to the denominator of the fraction for the generated fractional currents. Each of the two dozen other transistors 83–86 has a channel size, represented by the numeral one, that has in this example one-eighth of the current conduction $I_{Ri}$ of the sense amplifier's transistor 81. The p-channel sources of each set of transistors $83_1$–$83_8$, $84_1$–$84_8$, $85_1$–$85_4$ and $86_1$–$86_4$ are connected to generate a cumulative fractional current $(1-m)I_{Ri}$ or $(m)I_{Ri}$ according to the number of active transistors in a particular set, where m is either 1/8, 2/8, 3/8 or 4/8 in this example. A set of transistors $91_1$–$91_4$, $92_1$–$92_4$, $93_1$–$93_4$ and $94_1$–$94_4$ serve as switches that selectively connect or disconnect certain transistors $83_5$–$83_8$, $84_5$–$84_8$, $85_1$–$85_4$, and $86_1$–$86_4$ to the power supply line. These switches are controlled by control signals ADD0–ADD3 and SUB0–SUB3 provided to their transistors. Additional transistors $89_1$–$89_4$ and $90_1$–$90_4$ are provided for symmetry so that all paths contributing to the current output are identical, but these additional transistors have their gates tied to ground instead of receiving control signals. ADD0–ADD3 control the switches $93_1$–$93_4$ and $94_1$–$94_4$ in the opposite manner from the corresponding SUB0–SUB3 control signals' control of switches $91_1$–$91_4$ and $92_1$–$92_4$. Thus, when only four transistors $83_1$–$83_4$ are active in the first set for $(1-m)=4/8$, all four transistors $85_1$–$85_4$ in the corresponding set will be active for m=4/8; when five transistors $83_1$–$83_5$ are active for $(1-m)=5/8$, only three transistors $85_2$–$85_4$ will be active for m=3/8; etc. This ensures that $(1-m)+m=1$ in actual implementation. The fractional currents are then combined as discussed above with reference to FIG. 6. The second bank of transistors in FIG. 7, $84_1$–$84_8$, $86_1$–$86_4$, $92_1$–$92_4$, and $94_1$–$94_4$, is not needed for reference current $I_{R00}$ as only one set of fractional currents is needed.

For reference current $I_{R11}$, the fractional current generating circuit element in FIG. 7, is modified to include a third partial bank driven by the BIAS voltage and controlled by ADD0–ADD3 in a manner like transistors $85_1$–$854$ and $86_1$–$86_4$. This modification provides three fractional current versions of $(m)I_{R11}$, needed to produce $I_{11H}=(1+m)I_{R11}=(1-m)I_{R11}+(m)I_{R11}+(m)I_{R11}$. Alternatively, the fractional current generating circuit element in FIG. 7 can be modified so that control signals SUB0–SUB3 may be independently supplied to the two banks (rows) of transistors, whereby in the (erase) verify mode of operation, the transistors $83_1$–$83_8$ supply $(1)I_{R11}$ (here i="11") instead of $(1-m)I_{R11}$, while transistors $84_1$–$84_8$ still provide current $(1-m)I_{R11}$. This enables the current level $I_{11H}=(1+m)I_{R11}=(1)I_{R11}+(m)I_{R11}$ to be provided by the first bank or row of the circuit, while $I_{11L}$ and $I_{10L}$ are still supplied with the current contributions $(1-m)I_{R11}$ and $(m)I_{R11}$ respectively, from the second bank or row of that circuit.

Referring back to FIG. 1, the next step 302 in the method of the present invention is to determine which of the memory cells in the memory array have been overerased. This is done by reading the contents of the cell in the usual manner to determine the memory cell states of the memory cells. Again, if the conduction current read during the read operation exceeds that of the highest reference current of the erased state current window, then the memory cell is considered to be overerased.

Then, in step 303, the overerased cells are programmed until all of the overerased memory cells are in the erased state. With reference to FIG. 8, the programming method used can be the staircase programming method described above with reference to FIG. 10. As shown in FIG. 8, an alternating sequence of programming 241, 242, 243 and verifying 251, 252, 253 pulses are applied to the memory cell. The voltage 230 of each

What is claimed is:

1. A method of recovering overerased bits in a memory device following an erase operation, said method comprising:
    generating a first reference current in the memory device, said first reference current defining a highest current of a current window corresponding to a first reference level defining a state in which a memory cell is in an erased state,
    determining from a plurality of memory cells a first group of memory cells that have an amount of charge on its floating gate corresponding to a conduction current that is greater than the first reference current, said first group of memory cells being in an overerased state; and
    applying a plurality of programming pulses to each of the first group of memory cells to place an amount of charge on the floating gate of said cell until the conduction current is less than the first reference current, such that each of the first group of memory cells is programmed from the overerased state to the erased state.

2. The method of claim 1 further comprising:
    applying a plurality of verify pulses to the specified memory cell, each one of said verify pulses being applied after each one of said programming pulses in an alternating manner.

3. The method of claim 1 wherein said programming pulses increase incrementally in voltage to increase the amount of charge on the floating gate at a steady rate.

4. The method of claim 1 further comprising:
    generating a second reference current in the memory device, said second reference current defining a lowest current of a current window corresponding to the first reference level defining the state in which a memory cell is in the erased state.

5. The method of claim 1 wherein the memory cell has two memory states per cell.

6. The method of claim 1 wherein the memory cell has four memory states per cell.

7. The method of claim 1 wherein the memory cell is a multi-level memory cell.

8. The method of claim 1 wherein the step of determining the first group includes reading the plurality of memory of cells and comparing the conduction current of each memory cell read to the first reference current.

9. A method of recovering overerased bits in a memory device following an erase operation, said method comprising:

generating a first reference current in the memory device, said first reference current defining a highest current of a current window corresponding to a first reference level defining a state in which a memory cell is in an erased state;

reading a plurality of memory cells to determine a first group of memory cells that have an amount of charge on its floating gate corresponding to a conduction current that is greater than the first reference current, said first group of memory cells being in an overerased state;

applying a plurality of programming pulses to program each of the first group of memory cells to place an amount of charge on the floating gate of said cell until the conduction current is less than the first reference current, such that each of the first group of memory cells is programmed from the overerased state to the erased state; and applying a plurality of verify pulses to the specified memory cell, each one of said verify pulses being applied after each one of said programming pulses in an alternating manner.

10. The method of claim 9 wherein said programming pulses increase incrementally in voltage to increase the amount of charge on the floating gate at a steady rate.

11. The method of claim 9 further comprising:

generating a second reference current in the memory device, said second reference current defining a lowest current of a current window corresponding to the first reference level defining the state in which a memory cell is in the erased state.

12. A method of recovering overerased bits in a memory device following an erase operation, said method comprising:

generating a first reference current and a second reference current in the memory device, said first reference current and said second reference current defining a current window defining a first reference level corresponding to a state in which a memory cell is in an erased state, said first reference current defining a highest current of the current window and said second reference current defining a lowest current of the current window;

determining from a plurality of memory cells a first group of memory cells that have an amount of charge on its floating gate corresponding to a conduction current that is greater than the first reference current, said first group of memory cells being in an overerased state;

applying a plurality of programming pulses to each of the first group of memory cells to place an amount of charge on the floating gate of said cell, said programming pulses increasing incrementally in voltage to increase the amount of charge on the floating gate at a steady rate until the conduction current is less than the first reference current, such that each of the first group of memory cells is programmed from the overerased state to the erased state; and applying a plurality of verify pulses to the specified memory cell, each one of said verify pulses being applied after each one of said programming pulses in an alternating manner.

13. The method of claim 12 wherein the step of determining the first group includes reading the plurality of memory of cells and comparing the conduction current of each memory cell read to the first reference current.

14. The method of claim 12 wherein the memory cell is a multi-level memory cell.

15. The method of claim 12 wherein the memory cell is a single bit per cell memory device.

* * * * *

UNITED STATES PATENT AND TRADEMARK OFFICE
CERTIFICATE OF CORRECTION

PATENT NO. : 6,724,662 B2
DATED : September 4, 2002
INVENTOR(S) : Danut I. Manea It is certified that error appears in the above-identified patent and that said Letters Patent is hereby corrected as shown below:

Column 5,
Line 42, "The reference current levels $I_{R00}$, $I_{RO1}$, $R_{10}$ and ..." should read -- The reference current levels $I_{R00}$, $I_{RO1}$, $I_{R10}$ and --.
Line 60, "$I_H = (0.50) I_{R10} + (0.50) I_{R10}$" should read -- $I_H = (0.50) I_{R10} + (0.50) I_{R11}$ --.

Column 8,
Lines 18-20, "Indeed, it might be desired to have the separation between $I_{R11}$ and $I_{R11}$ greater than the separation between ..." should read -- Indeed, it might be desired to have the separation between $I_{R11}$ and $I_{R10}$ greater than the separation between --.

Column 9,
Lines 55-56, "... transistors $85_1$-$854$ and $86_1$-$86_4$. ..." should read -- transistors $85_1$-$85_4$ and $86_1$-$86_4$. ... --.

Column 10,
Line 19, "The voltage 230 of each" should read in completion as follows -- The voltage 230 of each programming pulse incrementally increases with respect to time 232 from overerased state 250 to the erased state 260. --

Signed and Sealed this

Fifteenth Day of February, 2005

JON W. DUDAS
*Director of the United States Patent and Trademark Office*